US010383261B2

(12) United States Patent
Krivonak et al.

(10) Patent No.: US 10,383,261 B2
(45) Date of Patent: Aug. 13, 2019

(54) HEAT TRANSFER CHASSIS AND METHOD FOR FORMING THE SAME

(71) Applicant: General Electric Company, Schenectady, NY (US)

(72) Inventors: Andrew Louis Krivonak, Erie, PA (US); Theodore Clark Brown, Ripley, NY (US); Shreenath Shekar Perlaguri, Bangalore (IN); Brian Magann Rush, Niskayuna, NY (US); Rajendra Yammanuru, Bangalore (IN); Naveenan Thiagarajan, Niskayuna, NY (US); Arunpandi Radhakrishnan, Bangalore (IN)

(73) Assignee: GE GLOBAL SOURCING LLC, Norwalk, CT (US)

(*) Notice: Subject to any disclaimer, the term of this patent is extended or adjusted under 35 U.S.C. 154(b) by 94 days.

(21) Appl. No.: 15/222,478

(22) Filed: Jul. 28, 2016

(65) Prior Publication Data
US 2017/0112018 A1    Apr. 20, 2017

Related U.S. Application Data

(63) Continuation-in-part of application No. 14/918,082, filed on Oct. 20, 2015, now Pat. No. 10,032,693.

(51) Int. Cl.
H05K 7/20        (2006.01)
H01L 23/467    (2006.01)
H01L 23/473    (2006.01)

(52) U.S. Cl.
CPC ....... H05K 7/20927 (2013.01); H01L 23/467 (2013.01); H01L 23/473 (2013.01);
(Continued)

(58) Field of Classification Search
CPC .......... H05K 7/20263; H05K 7/20336; H05K 7/20881; H01L 23/467; H01L 23/473
(Continued)

(56) References Cited

U.S. PATENT DOCUMENTS 3,851,221 A  *  11/1974  Beaulieu ............... H01L 23/44
                                                                    361/679.31
5,842,514 A  *  12/1998  Zapach ................ H01L 23/427
                                                                      165/104.33
(Continued)

FOREIGN PATENT DOCUMENTS

FR            2989481 A1  *  10/2013  .............. G06F 1/20
WO    WO 03016811 A2  *   2/2003  .............. C09K 5/14
WO    WO 2015049807 A1  *  4/2015  .......... H05K 1/0204

Primary Examiner — Cassey D Bauer
Assistant Examiner — Jenna M Hopkins
(74) Attorney, Agent, or Firm — Christopher R. Carroll; The Small Patent Law Group LLC

(57) ABSTRACT

A system includes a front plate, first and second side plates extending from the front plate, a bridge heat sink coupled to and extending from the front plate between the side plates, and a heat pipe coupled to the front plate. The front plate defines a slot therethrough between the front and back sides. The first side plate includes a fin bank mounted on an outer side thereof. The bridge heat sink defines a fluid channel that is fluidly connected to the slot of the front plate. The fluid channel is configured to receive a first cooling fluid therein to dissipate heat from electronics packages that engage the bridge heat sink. The heat pipe extends to and at least partially through the fin bank. The heat pipe contains a second cooling fluid therein that transfers heat absorbed from the front plate to the fin bank for dissipating heat.

20 Claims, 8 Drawing Sheets

(52) U.S. Cl.
    CPC ..... *H05K 7/20263* (2013.01); *H05K 7/20336* (2013.01); *H05K 7/20881* (2013.01)

(58) Field of Classification Search
    USPC .............................. 165/80.2; 361/700, 679.52
    See application file for complete search history.

(56) References Cited

U.S. PATENT DOCUMENTS

| | | | | |
|---|---|---|---|---|
| 6,104,611 A * | 8/2000 | Glover | ................... | F28D 15/06 |
| | | | | 165/104.33 |
| 7,130,193 B2 * | 10/2006 | Hirafuji | ............. | H05K 7/20336 |
| | | | | 361/700 |
| 7,345,877 B2 * | 3/2008 | Asfia | .................. | H05K 7/20672 |
| | | | | 165/104.33 |
| 7,457,118 B1 * | 11/2008 | French | ............... | H05K 7/20936 |
| | | | | 361/679.48 |
| 7,460,367 B2 * | 12/2008 | Tracewell | .......... | H05K 7/20672 |
| | | | | 165/104.21 |
| 8,023,267 B2 * | 9/2011 | Streyle | ............... | H05K 7/20545 |
| | | | | 165/80.1 |
| 8,027,162 B2 * | 9/2011 | Campbell | ............ | H05K 7/2079 |
| | | | | 165/104.33 |
| 8,363,412 B2 * | 1/2013 | Budai | ..................... | G06F 1/185 |
| | | | | 165/104.33 |
| 8,385,069 B2 * | 2/2013 | Iyengar | .................... | G06F 1/20 |
| | | | | 165/80.4 |
| 8,391,008 B2 * | 3/2013 | Dede | .................. | H01L 23/4735 |
| | | | | 165/104.21 |
| 8,488,323 B2 * | 7/2013 | Peterson | ................... | G06F 1/20 |
| | | | | 165/104.33 |
| 8,587,943 B2 * | 11/2013 | Barina | ................. | H01L 23/427 |
| | | | | 165/104.33 |
| 8,913,384 B2 * | 12/2014 | David | ................... | H05K 13/00 |
| | | | | 361/679.53 |
| 9,027,360 B2 * | 5/2015 | Chainer | ............. | H05K 7/20781 |
| | | | | 62/259.2 |
| 9,307,674 B2 * | 4/2016 | Chainer | ............. | H05K 7/20772 |
| 9,312,580 B2 * | 4/2016 | Nguyen | ............... | H01M 10/625 |
| 9,370,124 B2 * | 6/2016 | Tantolin | ............. | H05K 7/20672 |
| 9,867,315 B2 * | 1/2018 | Berk | .................. | H05K 7/20254 |
| 2006/0011330 A1 * | 1/2006 | Wang | ................... | H01L 23/467 |
| | | | | 165/122 |
| 2007/0034360 A1 * | 2/2007 | Hall | ........................ | G06F 1/183 |
| | | | | 165/104.33 |
| 2007/0070601 A1 * | 3/2007 | Vos | ....................... | H05K 7/1404 |
| | | | | 361/694 |
| 2008/0060789 A1 * | 3/2008 | Lee | ..................... | H05K 7/1404 |
| | | | | 165/80.2 |
| 2008/0084667 A1 * | 4/2008 | Campbell | .......... | H05K 7/20009 |
| | | | | 361/702 |
| 2008/0264613 A1 * | 10/2008 | Chu | ................... | H01L 23/4093 |
| | | | | 165/104.33 |
| 2009/0190303 A1 * | 7/2009 | Chu | ........................ | G06F 1/20 |
| | | | | 361/679.47 |
| 2009/0213543 A1 * | 8/2009 | Nemoz | .............. | H05K 7/20563 |
| | | | | 361/694 |
| 2010/0252234 A1 * | 10/2010 | Cambell | ............... | H01L 23/473 |
| | | | | 165/80.2 |
| 2010/0319986 A1 * | 12/2010 | Bleau | ..................... | G06F 1/181 |
| | | | | 174/520 |
| 2011/0069454 A1 * | 3/2011 | Campbell | ........... | H05K 7/2079 |
| | | | | 361/700 |
| 2011/0083824 A1 * | 4/2011 | Rogers | ............... | H05K 7/20745 |
| | | | | 165/80.2 |
| 2012/0312345 A1 * | 12/2012 | Ward | ...................... | H01L 35/02 |
| | | | | 136/230 |
| 2013/0120910 A1 * | 5/2013 | Watanabe | ............. | H01G 9/155 |
| | | | | 361/517 |
| 2014/0292120 A1 * | 10/2014 | Kalev | ..................... | H02K 9/19 |
| | | | | 310/54 |
| 2015/0109728 A1 * | 4/2015 | Campbell | .......... | H05K 7/20236 |
| | | | | 361/679.47 |
| 2016/0295679 A1 * | 10/2016 | Yeini | .................... | H01L 23/427 |
| 2017/0311481 A1 * | 10/2017 | Fujii | .................. | F28D 15/0266 |
| 2017/0313159 A1 * | 11/2017 | Takagi | ............... | B60H 1/00914 |

\* cited by examiner

HEAT TRANSFER CHASSIS AND METHOD FOR FORMING THE SAME

CROSS-REFERENCE TO RELATED APPLICATIONS

This application is a continuation-in-part of U.S. patent application Ser. No. 14/918,082, which was filed on 20 Oct. 2015, and the entire disclosure of which is incorporated herein.

FIELD

Embodiments of the subject matter described herein relate to a chassis that transfers heat away from electronic components held by the chassis.

BACKGROUND

Various vehicle systems and industrial machinery have control units that house electronic control components within a case. The electronic control components held in the control unit may be processing components (e.g., a central processing unit or CPU), input/output components, power control components, tractive and/or braking control components, heating and/or cooling control components, and the like. The electronic control components may include circuit boards and electronic devices electrically connected to the circuit boards. During operation, the electronic control components may generate significant heat within the case of the control unit. The heat may negatively affect operation of the electronic control components, and potentially may damage the electronic control components.

To dissipate heat away from the electronic control components, some control units may direct an air stream through the case such that the flowing air absorbs heat through convection before the air is exhausted out of the case. The flowing air may include dirt, debris, moisture, or other contaminants that may damage the electronic control components if the air contacts the electronic control components directly. For example, in a vehicle application, the air directed through the control unit may be ambient air from the environment that the vehicle system is traveling through. Sufficiently filtering and conditioning the ambient air prior to directing the air through the control unit may be undesirable. It may be desirable, however, to have systems and methods that differ from those that are currently available.

BRIEF DESCRIPTION

In one embodiment, a system (e.g., a heat transfer chassis) includes a front plate, a manifold cover, and bridge heat sinks. The front plate has a front side and a back side. The front plate defines multiple slots through the front plate between the front and back sides. The manifold cover is secured to the front plate to define a fluid distribution chamber along the front side of the front plate. The manifold cover defines a port opening through which a cooling fluid is received from outside of the manifold cover. The bridge heat sinks extend rearward from the back side of the front plate. The bridge heat sinks define fluid channels that are fluidly connected with the fluid distribution chamber through the corresponding slots of the front plate. The fluid distribution chamber is configured to distribute the cooling fluid received from outside of the manifold cover through the fluid channels of the bridge heat sinks in order to cool one or more electronics packages disposed along the bridge heat sinks without the cooling fluid engaging the one or more electronics packages.

In another embodiment, a method (e.g., for forming a heat transfer chassis) includes coupling a plurality of bridge heat sinks between a front plate and a rear plate to form a chassis assembly. The bridge heat sinks each include a base plate and a fin plate that engage one another at a respective top interface and a respective bottom interface and define a fluid channel laterally therebetween that extends through the bridge heat sink. Front openings of the fluid channels of the bridge heat sinks are fluidly connected to corresponding front slots defined through the front plate. Rear openings of the fluid channels are fluidly connected to corresponding rear slots defined through the rear plate. The bridge heat sinks are laterally spaced apart from one another to define cavities between pairs of adjacent bridge heat sinks. The method includes applying a metallic filler material to the chassis assembly at the top interfaces and the bottom interfaces of the bridge heat sinks and at front and rear chassis joints of the chassis assembly. The front chassis joints are defined between the bridge heat sinks and the front plate. The rear chassis joints are defined between the bridge heat sinks and the rear plate. The method further includes brazing the chassis assembly to form a unitary chassis body. The metallic filler material fuses the base plates to the respective fin plates of the bridge heat sinks at the respective top and bottom interfaces. The metallic filler material fuses the bridge heat sinks to the front plate and to the rear plate at the front chassis joints and rear chassis joints, respectively.

In another embodiment, a system (e.g., a heat transfer chassis system) includes a front plate, first and second side plates, a bridge heat sink, and a heat pipe. The front plate has a front side and a back side and extends between a first end and second end. The front plate defines a slot therethrough between the front and back sides. The first and second side plates are coupled to and extend rearward from the front plate. The first and second side plates are disposed at least proximate to the first and second ends, respectively, of the front plate. The first side plate includes a fin bank mounted on an outer side thereof that faces away from the second side plate. The bridge heat sink is coupled to and extends rearward from the back side of the front plate between the first and second side plates. The bridge heat sink defines a fluid channel that is fluidly connected to the slot of the front plate. The fluid channel is configured to receive a first cooling fluid therein to dissipate heat from one or more electronics packages engaging the bridge heat sink. The heat pipe is coupled to the front plate. The heat pipe contains a second cooling fluid therein. The heat pipe extends to and at least partially through the fin bank. The heat pipe provides a closed fluid path for the second cooling fluid to transfer heat absorbed from the front plate to the fin bank for dissipating heat to an external environment.

In another embodiment, a system (e.g., a heat transfer chassis system) includes a chassis, a fin bank, and a heat pipe. The chassis includes front plate, a rear plate, and first and second side plates coupled to and extending between the front plate and the rear plate to define a chamber. The chassis further includes a bridge heat sink coupled to and extending between the front and rear plates between the first and second side plates. The bridge heat sink defines a fluid channel therethrough that is fluidly connected to corresponding slots defined through the front and rear plates. The chassis is configured to receive a first cooling fluid through the slots of the front and rear plates and the fluid channel of the bridge heat sink to dissipate heat from one or more electronics packages engaging the bridge heat sink within the chamber. The fin bank is mounted to the first side plate along an outer side thereof that faces away from the second side plate. The heat pipe is coupled to the front plate. The heat pipe contains a second cooling fluid therein. The heat pipe extends to and at least partially through the fin bank. The heat pipe provides a closed fluid path for the second cooling fluid to transfer heat absorbed from the front plate to the fin bank for dissipating heat to an external environment.

DETAILED DESCRIPTION

Figure 1:
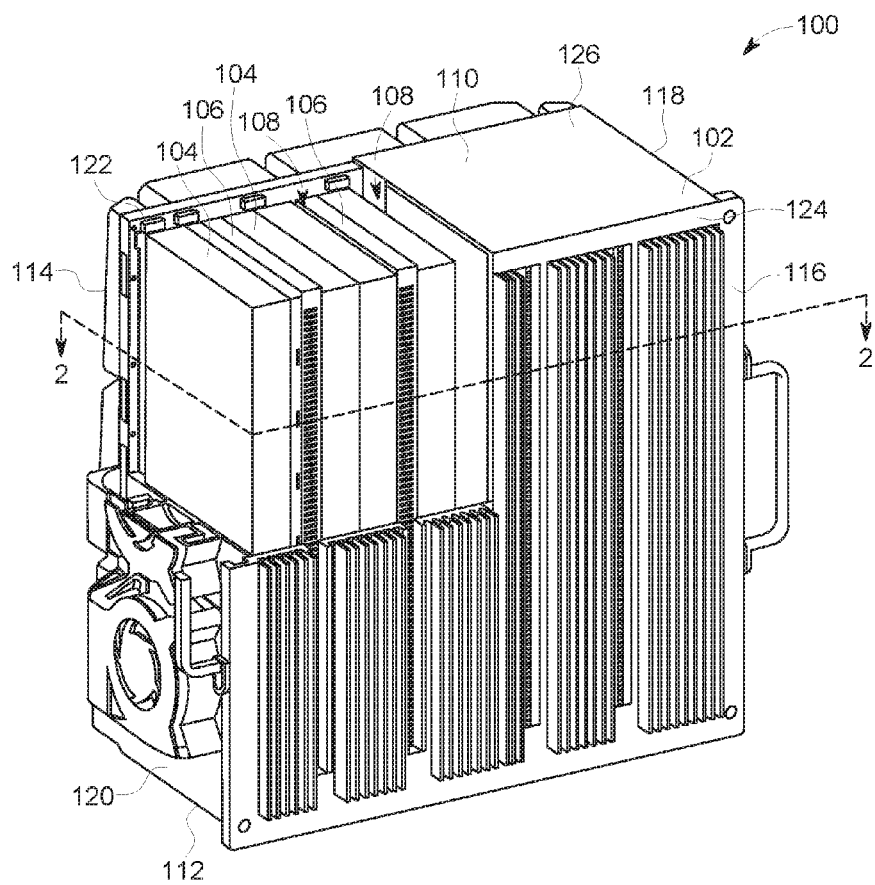
FIG. 1 is a perspective, partial cut-away view of an electronics system according to an embodiment.

Embodiments of the subject matter described herein relate to a chassis that transfers heat away from electronic components held by the chassis. In one embodiment, a heat transfer chassis is an assembly of heat exchangers with thermally-conductive interfaces or joints between intersecting heat exchangers. The heat transfer chassis does not require gaskets at the joints to prevent leaking. The heat transfer chassis acts as a manifold to receive cold air in one end, distribute the cold air to internal heat exchangers which conduct heat away from electronics, and exhaust the heated air out a second end.

A heat transfer chassis may include multiple internal heat exchangers. Each heat exchanger may be formed from two discrete pieces that may be brazed together to create a single heat exchanger having an array of fins to increase heat transfer surface area. The internal heat exchangers may be stacked between, and bridge, a conductive front plate and a conductive back plate. A hollow cover may be mounted to a front face of the front plate to define a manifold that receives air from fans and distributes the air to each of the internal heat exchangers through slots in the front plate. The front face of the front plate includes pin fins to provide additional convective cooling surface area with minimal air friction. The back plate defines a number of slots that align with the internal heat exchangers to allow the heated air exiting the internal heat exchangers to exhaust through the back plate to the ambient air. A back face of the back plate includes vertical fins to provide additional convective cooling surface area. The chassis components (e.g., the internal heat exchangers, the front plate, the rear plate, and the cover) may be then coupled together (as an assembly) with a filler material disposed along each contact interface. Suitable coupling methods may include dip-brazing. Coupling the assembly forms a single, one-piece (e.g., unitary) chassis body or structure which requires no gaskets or other means to prevent air leaks at joints. The chassis body has a thermally conductive interface between two or more parts. This interface may allow a substantial portion of the surface area of the chassis body to conduct heat away from the electronics for increased heat dissipation to the ambient air (e.g., relative to chassis structures that have less of a percentage or amount of conductive material along the surface area). The interfaces may be electrically conductive, which allow the chassis to function as a grounding source or path for the electronics held by the chassis. In one non-limiting example embodiment, the chassis includes four internal heat exchangers for cooling and accommodating seven printed circuit boards (or other electronic devices). However, the size of the chassis can be scaled up or down based on type, quantity, and size of the electronics to be cooled, magnitude of heat to dissipate, and quantity of available air for cooling. In addition, the interfaces between the internal heat exchangers and the electronics can be tuned to accommodate the design characteristics of the electronics (e.g., sizes, shapes, orientations, and arrangements of the electrical components). Some electronics packages have an entire face available for engaging the internal heat exchanger to transfer heat to the internal heat exchanger. The electronics package may contact the heat exchangers directly or indirectly via the use of a thermal interface material between the face of the heat exchanger and the face of the electronic package. Other electronics packages may require edge conduction based on constraints from the device layout of the circuit board, such as due to electrical components being arranged on both faces of the circuit board.

One or more embodiments of the heat transfer chassis described herein provide distribution of a cooling fluid from a single source to multiple heat exchangers. The number of heat exchangers can be scaled to accommodate various sizes and quantities of electronics. The heat exchangers receive a cooling fluid through internal channels. The cooling fluid in the channels does not contact or interact directly with the electronics held by the chassis, which maintains cleanliness and reliability of the electronics over the life of the chassis. In addition, the heat exchanger geometry can be tuned to accommodate various cooling approaches driven by the geometry of the electronics, such as by providing edge conduction or face conduction between an electronics package and an internal heat exchanger. Furthermore, the interfaces between the components of the chassis (e.g., panels, plates, and heat exchangers) may be thermally conductive, which increases an amount of surface area of the chassis that conducts heat away from the electronics into the cooling fluid. The interfaces may be sealed to prevent leaks from the cooling fluid. The seal may be accomplished without using gaskets or adhesives, such as epoxies. The interfaces may be electrically conductive, so the chassis defines a conductive path between the internal heat exchangers and plates at the ends of the heat exchangers. The electrically conductive interfaces allow the chassis to be used for grounding the electronics to an electronic ground reference.

Reference is made to the appended drawings. Wherever convenient, the same reference numerals may be used throughout the drawings refer to the same or like parts.

FIG. 1 may be a perspective, partial cut-away view of an electronics system 100 according to an embodiment. The electronics system 100 includes a chassis system 102 and one or more electronics packages 104 held on the chassis system. The chassis holds the electronics packages. The chassis provides cooling for the electronics packages by receiving heat generated by the electronics packages and passively transferring the heat to a cooling fluid flowing through the chassis. The chassis defines a closed fluid circuit such that the cooling fluid does not directly engage the electronics packages. For example, the chassis defines barriers between the cooling fluid and the electronics packages that are permeable to heat transfer but are not permeable to mass transfer. Heat is transferred across the barriers to be absorbed by the cooling fluid, without allowing molecules of the cooling fluid to migrate across the barrier to the electronics packages. By mechanically separating the cooling fluid from the electronics packages, the electrical components on the electronics packages are not exposed to dust, dirt, debris, moisture, or other contaminants that may be present in the cooling fluid. Filtering and/or conditioning the cooling fluid prior to the cooling fluid flowing through the chassis may not be required, possibly due to it being a closed system. Ambient air is used as the cooling fluid without first filtering the air (to remove dust and dirt) and/or conditioning the air (e.g., to reduce humidity and/or temperature).

The electronics packages held by the chassis may provide control functions, communication functions, data storage functions, data processing functions, or the like. Once or more electronics packages may include or represent hardware circuits or circuitry that include and/or are connected with one or more processors, such as one or more computer microprocessors. One or more electronics packages may be or includes a substrate, such as a printed circuit board. In particular embodiments, the substrate is a portion of a processor. The electronics packages 104 may include one or more electrical components mounted to the substrate, such as processing devices (e.g., microprocessors, central processing units (CPUs), or the like), control devices, memories, input/output devices, power supply devices, or the like. Different electronics packages may have different functions in a particular application.

The electronics system is modular and may be used in various applications. For example, the electronics system may be mounted in an aircraft, a land vehicle, or a water vessel during a trip. Suitable land vehicles may include an automobile, rail vehicle, mining vehicle, or an off-highway vehicle (OHV) (e.g., a vehicle system that is not designed for travel on public roadways). Alternatively, the electronics system may be used with industrial machinery. It may control machinery in a manufacturing plant or an assembly plant. In another embodiment, the electronics system may be used in a data storage or data processing facility.

In one application, the electronics system is a control unit of a vehicle system. The vehicle system may include multiple vehicles logically coupled together to travel together along a defined route. One or more electronics packages held by the chassis may be used to control tractive and/or braking efforts of the rail vehicle system by generating tractive and/or braking settings of the rail vehicle system as a function of location along the route. For example, the electronics packages may generate or at least implement a trip plan for the rail vehicle system. The trip plan designates one or more operational settings for the rail vehicle system to implement or execute during a trip as a function of time and/or location along the route. The operational settings may include dictated speeds, throttle settings, brake settings, accelerations, or the like, of the rail vehicle system. Other electronics packages are used for communicating with a remote location, such as a dispatch, a wayside device, another rail vehicle system, or another vehicle in the same rail vehicle system. Still other electronics packages may function to track and monitor progress of the rail vehicle system during movement along the route, such as by measuring, recording, and/or receiving data parameters regarding the movement of the rail vehicle system along the route, such as route information, location information, speed information, and the like.

In an embodiment, the electronics system houses multiple electronics packages. Each electronics package may include an inverter for driving a traction motor. Traction motor electronics may each consume 1000 kilowatts (kW). A combination of multiple electronics packages may consume dozens of kW. The chassis would then have to dissipate the corresponding heat generated by the consumption and use of so many kW of power. The more loss in the system, the heat is generated. And, some operating modes generate more heat than other modes even with a constant rate of loss. Further, the resistance may rise over time as components age, leading to greater loss and more heat generation.

The electronics system has a top 110, a bottom 112, a front 114, a rear 116, a first side 118, and an opposite second side 120. As used herein, relative or spatial terms such as "top," "bottom," "front," "rear," "first," and "second" are only used to distinguish the referenced elements and do not necessarily require particular positions or orientations in the chassis, the electronics system, or in the surrounding environment of the electronics system. The chassis includes multiple bridge heat sinks 106 that are spaced apart laterally from one another to define a corresponding cavity 108 between each pair of adjacent bridge heat sinks. The electronics packages are held by the chassis in the cavities. The bridge heat sinks thermally engage the electronics packages to dissipate heat that is generated and/or emitted by the electronics packages. The chassis further includes a front plate 122 and a rear plate 124. In the illustrated embodiment, the rear plate of the chassis defines the rear of the electronics system. The rear plate is secured to a housing 126 that covers the front plate, the bridge heat sinks, and the electronics packages. The housing provides a barrier to prevent or reduce dust, dirt, debris, moisture, or other contaminants outside of the housing from engaging the electronics packages.

Figure 2:
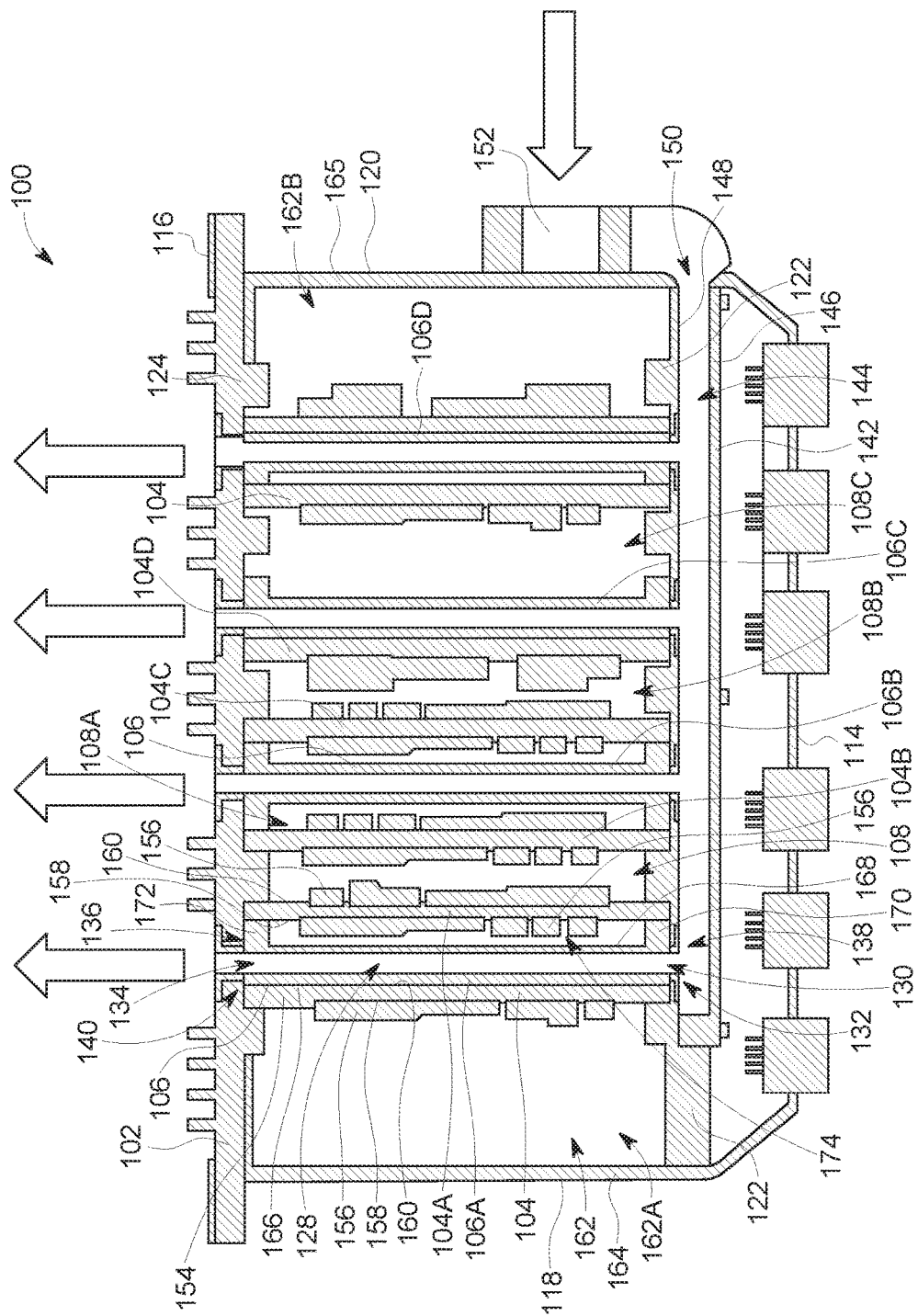
FIG. 2 illustrates a top cross-sectional view of the electronics system according to an embodiment.

FIG. 2 illustrates a cross-sectional view of the electronics system along line 2-2 shown in FIG. 1 according to an embodiment. In the illustrated embodiment, the chassis includes four bridge heat sinks, but the chassis may include more than four or less than four bridge heat sinks in other embodiments. Each bridge heat sink extends between the front plate and the rear plate. Each bridge heat sink defines a fluid channel 128 through the respective heat sink. The fluid channels extend longitudinally between a front opening 130 at a front end 132 of the respective bridge heat sink 106 and a rear opening 134 at a rear end 136 of the respective bridge heat sink. The fluid channels receive a cooling fluid therethrough. In the illustrated embodiment, the cooling fluid is air. In other embodiments, the cooling fluid is another gas at ambient conditions, such as hydrogen or an inert gas. Alternatively, the cooling fluid is a liquid at ambient conditions, such as water (alone or in a solution with one or more other chemicals).

The front openings 130 of the bridge heat sinks align with and are fluidly connected to slots 138 defined through the front plate. The rear openings of the bridge heat sinks align with and are fluidly connected to slots 140 defined through the rear plate. The chassis defines multiple fluid paths longitudinally through the chassis. The fluid paths extend through the front plate, through the fluid channel of a corresponding one of the bridge heat sinks, and through the rear plate.

Figure 3:
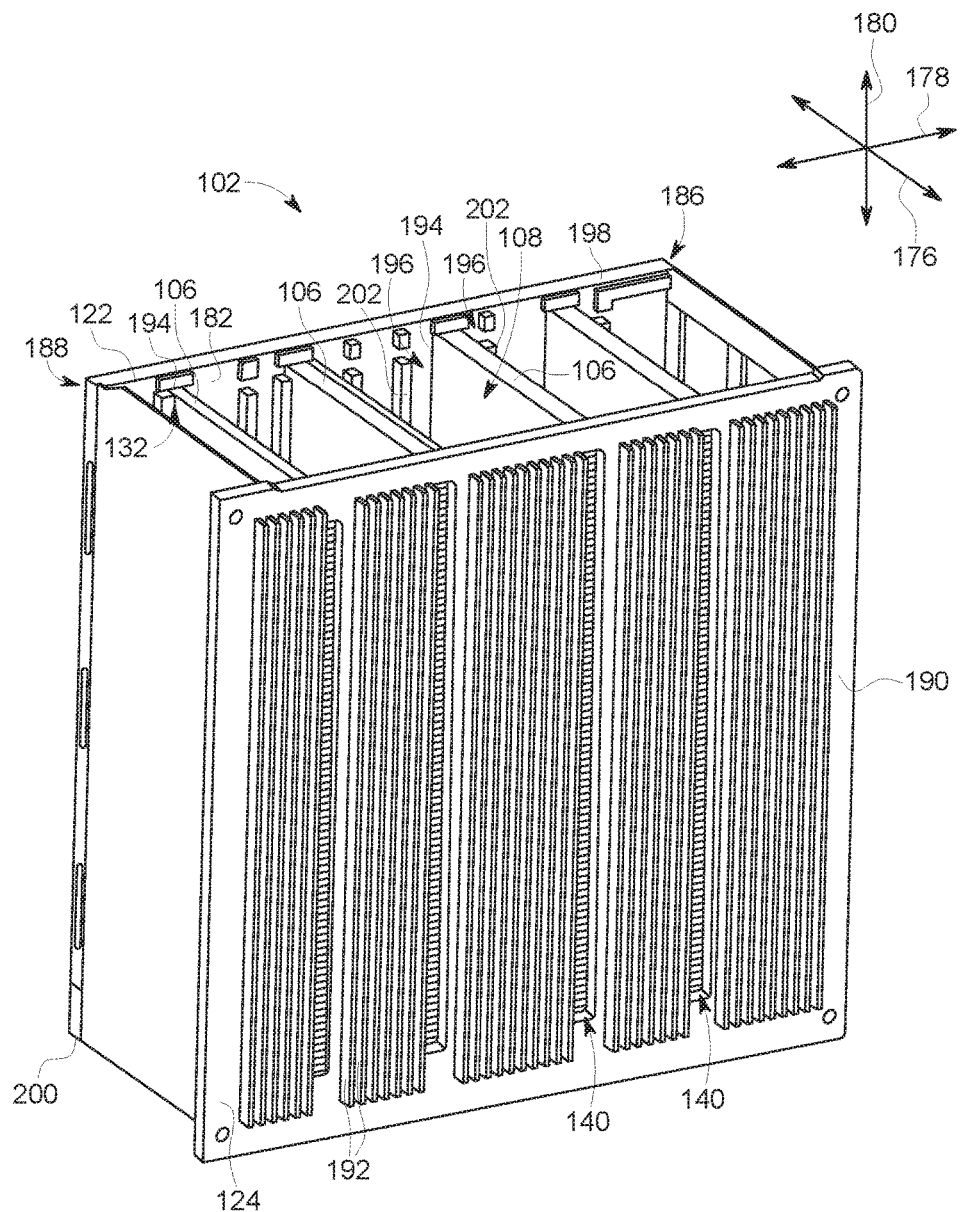
FIG. 3 is a rear perspective view of a chassis of the electronics system according to an embodiment.

In an embodiment, the front plate is coupled to a manifold cover 142. The manifold cover 142 and the front plate define a fluid distribution chamber 144. The fluid distribution chamber extends longitudinally between a base wall 146 of the manifold cover 142 and a front side 148 of the front plate. The fluid distribution chamber distributes cooling fluid from one or more input ports to one or more output ports. In the illustrated embodiment, the fluid distribution chamber includes four output ports defined by the four slots through the front plate. The fluid distribution chamber shows one port opening 150 along one end of the manifold cover. Optionally, the fluid distribution chamber may include more than one port opening along the same end, such that the openings are stacked vertically relative to one another, as shown in FIG. 3. In another embodiment, the fluid distribution chamber defines one or more port openings along the opposite end, along a top, and/or along a bottom of the manifold cover instead of, or in addition to, the port opening.

In the illustrated embodiment, the cooling fluid flows through the port opening into the fluid distribution chamber before flowing through the slots into the fluid channels of the bridge heat sinks. The cooling fluid is discharged from the fluid channels through the slots of the rear plate. Optionally, the rear plate of the chassis is open to the ambient environment such that the cooling fluid is exhausted to the ambient environment upon exiting the fluid channels and flowing across the rear plate. In an embodiment, the cooling fluid is propelled through the port opening by at least one fan 152. The fan blows the cooling fluid through the fluid channels from the front of the chassis to the rear, or is used to provide a vacuum that sucks the cooling fluid through the fluid channels from the rear to the front. Alternatively, the cooling fluid may be passively directed to the port opening, such as by using ducts to direct wind experienced by a moving vehicle to the electronics system onboard the moving vehicle. When the cooling fluid is forced through the fluid distribution chamber and the fluid channels of the chassis by the fan or another forced-air-producing device or by directing the air flow encountered by the electronics system onboard a moving vehicle, the electronics system is referred to as operating in an active mode that requires energy, such as to power the fan or the moving vehicle.

Although the illustrated embodiment shows the cooling fluid flowing from the front of the electronics system to the rear, it is recognized that the cooling fluid may flow in the opposite direction. For example, the cooling fluid may enter the chassis through the slots of the rear plate and may exit through the port opening. The cooling fluid may enter the slots of the chassis without intervention or may be drawn into the chassis by the fan or another device. The chassis may be reversible.

The bridge heat sinks are laterally spaced apart from one another along a width of the front plate and along a width of the rear plate. A pair of adjacent bridge heat sinks defines a corresponding cavity 108 therebetween. The cavities receive at least one electronics package therein. The bridge heat sinks thermally engage the electronics packages. As used herein, two components are "thermally engaged" with one another when a heat conduction path is formed between the two components such that heat transfers from the component with a higher temperature to the component with a lower temperature.

In the example configuration of the electronics system shown in FIG. 2, the chassis includes four bridge heat sinks. A first cavity 108A is defined between a first bridge heat sink 106A and a second bridge heat sink 106B adjacent to the first bridge heat sink 106A. A second cavity 108B is defined between the second bridge heat sink 106B and a third bridge heat sink 106C adjacent to the second bridge heat sink 106B. The second bridge heat sink 106B is disposed laterally between the first and third bridge heat sinks 106A, 106C along the width of the front plate. In the illustrated embodiment, the first cavity 108A includes two electronics packages therein. A first electronics package 104A in the first cavity 108A is disposed next to and is thermally engaged to the first bridge heat sink 106A. A second electronics package 104B is disposed between the first electronics package 104A and the second bridge heat sink 106B and is thermally engaged to the second bridge heat sink 106B. The second cavity 108B includes two electronics packages. A third electronics package 104C in the second cavity 108B is thermally engaged to the second bridge heat sink 106B, and a fourth electronics package 104D is thermally engaged to the third bridge heat sink 106C. The second bridge heat sink 106B is therefore in thermal engagement with both the second electronics package 104B and the third electronics package 104C, which are located on opposite sides of the second bridge heat sink 106B. As such, the second bridge heat sink 106B receives or absorbs heat generated by both the second and third electronics packages 104B, 104C and transfers the heat to the cooling fluid within the fluid channel of the second bridge heat sink 106B.

In an embodiment, due to size constraints or a lack of electronics packages, one or more cavities may include only one or zero electronics packages. For example, a third cavity 108C between the third bridge heat sink 106C and a fourth bridge heat sink 106D includes only one electronics package in the illustrated embodiment. The chassis optionally defines two end cavities 162 that are each configured to receive one electronics package therein. A first end cavity 162A is defined laterally between the first bridge heat sink 106A and a side plate 164 of the housing defining the first side 118 of the electronics system. A second end cavity 162B is defined laterally between the fourth bridge heat sink 106D and a side plate 165 of the housing defining the second side 120 of the electronics system. Although only seven are shown, the illustrated chassis receives eight electronics packages that are each thermally engaged with one of the bridge heat sinks to transfer heat away from the electronics packages. In other embodiments, the chassis may include more or less than four bridge heat sinks, and therefore receives more or less than eight electronics packages.

In the illustrated embodiment, the electronics packages include a thermally conductive panel 154 and electrical components 156 on the panel 154. The panel 154 includes a first side 158 and an opposite second side 160. The electrical components 156 are mounted along the first side 158, along the second side 160, or along both sides 158, 160. The thermally conductive panel 154 is a metal layer of a printed circuit board or is a sheet metal layer that is not part of a circuit board. During use, the electrical components 156 generate heat. At least some of the heat is absorbed by the thermally conductive panel. The bridge heat sinks are configured to thermally engage the thermally conductive panels of the corresponding electronics packages.

The bridge heat sinks include planar side walls on both sides of each bridge heat sink 106. The planar side walls are referred to in FIG. 2 as left planar side walls 166 and right planar side walls 168. The side walls face the electronics packages in the cavities. The side walls are defined by thermally conductive plates that allow heat to transfer through the side walls. The side walls extend for at least most of a height of the bridge heat sinks between a top and a bottom of the bridge heat sinks. In an embodiment, some of the side walls are configured to abut the thermally conductive panel 154 of the corresponding electronics package, while others of the side walls are configured to be spaced apart from the thermally conductive panel of the corresponding electronics package. For example, the left side wall of the first bridge heat sink 106A abuts the thermally conductive panel of the electronics package in the first end cavity 162A. The electronics package includes electrical components 156 disposed along the first side 158 of the panel, but not along the second side of the panel. The left planar side wall of the first bridge heat sink 160A abuts the second side of the panel in order to transfer heat from the panel to the bridge heat sink 106A across an engagement interface that extends a full length of the panel.

The right planar side wall 168 of the first bridge heat sink 106A, however, does not engage the first electronics package 104A in the first cavity 108A. The first electronics package 104A includes electrical components 156 along both the first and second sides 158, 160 of the thermally conductive panel 154. Due to varying heights of the electrical components 156 off of the first side 158, poor thermal coupling, and/or the risk of damaging the electrical components 156, the right side wall 168 of the first bridge heat sink 106A does not abut the first electronics package 104A. The first bridge heat sink 106A includes a front ledge 170 at the front end 132 and a rear ledge 172 at the rear end 136 that both project beyond the right planar side wall 168 towards the electronics package 104A. The front and rear ledges extend a farther distance from the right side wall 168 than the height of the tallest electrical component 156 relative to the first side 158 of the electronics package 104A. The front and rear ledges engage the thermally conductive panel of the first electronics package 104A while accommodating the electrical components 156 in a recess 174 defined between the front and rear ledges (such that the bridge heat sink 106A does not contact the electrical components). Therefore, the chassis accommodates and thermally engages both single-sided electronics packages that have electrical components on only one side of the panel and double-sided electronics packages that have electrical components on both sides of the panel.

FIG. 3 is a rear perspective view of the chassis of the electronics system according to an embodiment. The chassis is oriented along a longitudinal axis 176, a lateral axis 178, and a vertical axis 180 that are mutually perpendicular. The chassis may have any orientation relative to gravity. In an embodiment, the front plate and the rear plate extend parallel to one another and parallel to the lateral axis 178. The bridge heat sinks extend between a back side 182 of the front plate and a front side 184 (shown in FIG. 4) of the rear plate. The bridge heat sinks in an embodiment extend parallel to one another and parallel to the longitudinal axis 176. The bridge heat sinks are laterally spaced apart along the width of the front plate between a first end 186 and a second end 188 of the front plate to define the cavities 108. Optionally, the bridge heat sinks are not equally spaced along the width of the front plate such that the cavities do not all have the same lateral width. For example, the chassis may define different cavity sizes in order to accommodate electronics packages (shown in FIG. 2) of varying shapes and sizes. Optionally, at least some of the bridge heat sinks may have different thicknesses (along the lateral axis 178) relative to other bridge heat sinks. In an alternative embodiment, the bridge heat sinks extend at an oblique angle relative to the front and rear plates 122, 124 and/or relative to one another.

A back side 190 of the rear plate 124 is shown in FIG. 3. The multiple slots 140 of the rear plate extend longitudinally through the rear plate between the front side 184 (shown in FIG. 4) and the back side. The slots are oriented to extend vertically (e.g., parallel to the vertical axis 180). The slots align with and are fluidly connected to the fluid channels 128 (shown in FIG. 2) of the bridge heat sinks such that substantially all of the cooling fluid flowing from the fluid channels towards the rear plate flows through the slots 140 upon exiting the fluid channels and is ejected or discharged beyond the back side 190 of the rear plate. In an embodiment, the rear plate defines an array of fins 192 that protrude rearward from the back side 190. The fins 192 are vertically-extending ribs in the illustrated embodiment, but the fins may have other shapes, arrangements, and/or orientation in other embodiments. The fins increase the surface area of the rear plate that is exposed to an external environment, such as a cab of a locomotive or an outdoor environment, in order to dissipate heat from the chassis. The rear plate therefore is a heat sink to increase the amount or rate of heat dissipated from the chassis. As described with reference to FIG. 4, the front plate optionally may be a heat sink.

The front ends 132 of the bridge heat sinks engage the back side 182 of the front plate to define respective front chassis joints 194. Although not shown, the rear ends 136 (shown in FIG. 2) of the bridge heat sinks engage the front side 184 (shown in FIG. 4) of the rear plate to define rear chassis joints. The bridge heat sinks are joined to the front plate at the front chassis joints 194, and are joined to the rear plate at the rear chassis joints. In an embodiment, the chassis includes a metallic filler material (not shown) extending along the front chassis joints 194 and the rear chassis joints. The metallic filler material fuses or joins the bridge heat sinks to the front and rear plates 122, 124 during a brazing process. For example, the metallic filler material is applied to and along the front chassis joints 194 at interfaces between the bridge heat sinks and the front plate. During the brazing process, the metallic filler material is heated above its melting point and then allowed to cool, which fuses the bridge heat sinks to the front plate. The bridge heat sinks are joined to the rear plate through the same or at least a similar brazing process. After the brazing process fuses the bridge heat sinks to the front and rear plates, the chassis is a unitary, one-piece structure. In an embodiment, the metallic filler material seals the front chassis joints 194 and the rear chassis joints to prevent cooling fluid from leaking into the cavities and/or air or other gas in the cavities from leaking into the fluid channels (shown in FIG. 2).

In an embodiment, the bridge heat sinks are fused to the front plate and to the rear plate via a dip-brazing process. In the dip-brazing process, the bridge heat sinks are coupled to the front plate and the rear plate, at least temporarily, using fasteners, such as dowel pins, clips, or the like. Then, the metallic filler material is applied to the front chassis joints 194 and to the rear chassis joints, and the entire chassis assembly is lowered into a hot salt bath. Upon removing the chassis assembly from the bath and allowing the chassis assembly to cool, the metallic filler material hardens and fuses the front joints 194 and the rear joints, forming a unitary, one-piece body of the chassis. In other embodiments, the bridge heat sinks are fused or joined to the front and rear plates via other processes, such as soldering or welding.

The bridge heat sinks, the front plate, and the rear plate are composed of a thermally-conductive metallic material. For example, the bridge heat sinks and the front and rear plates may all be formed of a common aluminum alloy. The aluminum alloy has a higher melting point than the brazing filler material such that the filler material melts but the aluminum alloy does not melt during the brazing process (or other heat-induced joining process). Alternatively, the bridge heat sinks, the front plate, and/or the rear plate are formed of different aluminum alloys or alloys that do not contain aluminum. The metallic filler material is in the form of a paste, a powder, a slurry, a foil, a wire, a ribbon, a cream, or the like. The metallic filler material is an alloy that includes one or more of copper, nickel, iron, silver, aluminum, silicon, gold, or the like.

The metallic filler material is thermally conductive and electrically conductive. Therefore, an electrically conductive path extends across the front chassis joints 194 between the front plate and the bridge heat sinks due to the electrically conductive filler material at the joints 194. The electrically conductive path extends across the rear joints between the rear plate and the bridge heat sinks. Thus, the chassis is used to provide an electrical ground circuit for the electronics packages (shown in FIG. 2) mounted in the cavities 108. Furthermore, the electrically conductive properties of the chassis allow the chassis to provide electrical shielding for the electronics packages, such as to block at least some electromagnetic interference (EMI) and/or crosstalk from outside of the chassis and/or between electronics packages in different cavities of the chassis.

In an embodiment, the front plate of the chassis defines multiple tracks 196 that extend generally vertically (e.g., along the vertical axis 180). The tracks 196 may extend along a majority of the height of the front plate between a top 198 and a bottom 200 of the front plate. The tracks receive the electronics packages (shown in FIG. 2) therein to guide the electronics packages into thermal engagement with the bridge heat sinks. The tracks may be used to mount the electronics packages to the chassis, such as by securing the electronics packages in the tracks. The front plate may define two sets of tracks 196 in at least some of the cavities 108 between two bridge heat sinks in order to receive two electronics packages within the respective cavity. A first of the two tracks 196 is disposed proximate to one of the bridge heat sinks that define the cavity, and the other track 196 is disposed proximate to the other bridge heat sink defining the cavity. The tracks each include at least one rail 202 that engages a corresponding electronics package within the track. The rails engage the thermally conductive panels 154 (shown in FIG. 2) of the electronics packages. With additional reference to FIG. 2, the tracks may include one rail that engages the first side 158 of the panel 154, for example, to guide the second side 168 of the panel 154 into thermal engagement with the left side wall 166 or the front and rear ledges 170, 172 of the corresponding bridge heat sink 106. Alternatively, at least some of the tracks 196 may include more than one rail 202 in order to engage opposite sides of the electronics package.

Figure 4:
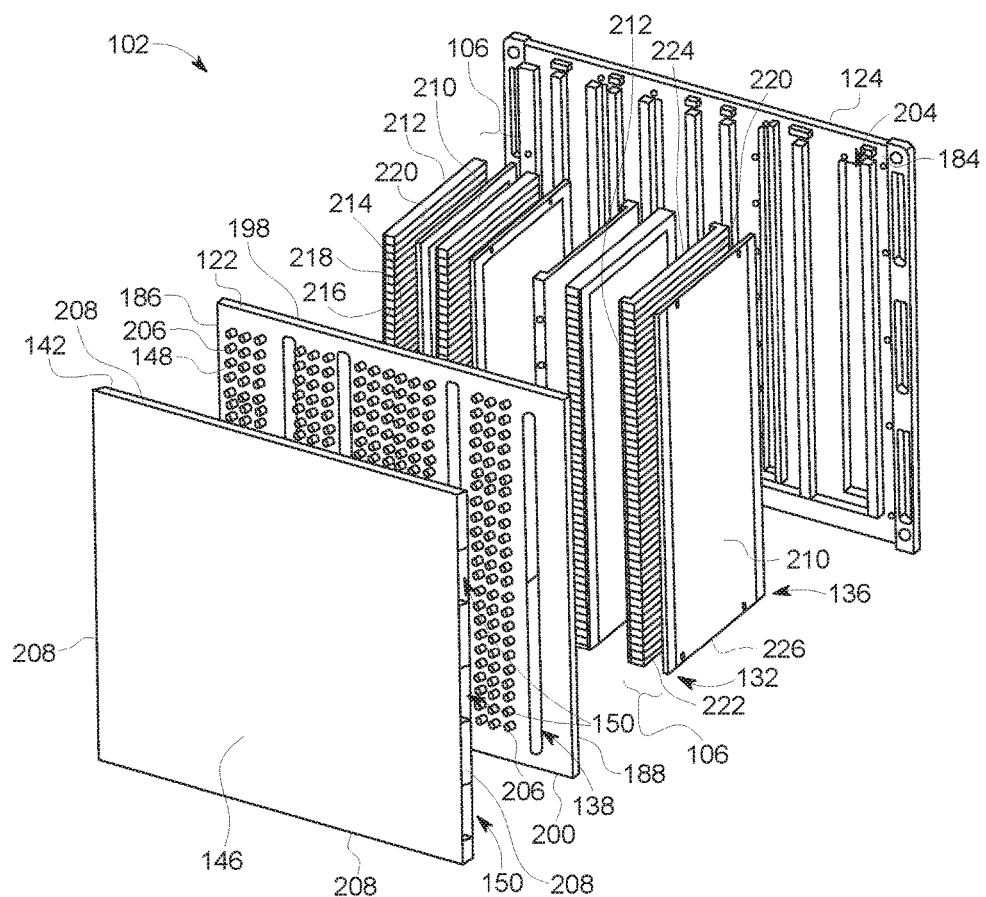
FIG. 4 is an exploded front perspective view of the chassis according to an embodiment.

Although not shown in FIG. 3, a fastener (e.g., a wedge lock fastener, a bolt, a clip, or the like) or an adhesive or glue is used to secure the electronics package (shown in FIG. 2) within the track. As shown in FIG. 4, the rear plate may include tracks 204 that extend from the front side 184 of the rear plate. The electronics packages are mounted to the chassis by securing the electronics packages to the front plate, to the rear plate, and/or to the adjacent bridge heat sinks.

FIG. 4 is an exploded front perspective view of the chassis according to an embodiment. The slots 138 of the front plate extend vertically along the front plate. The front plate includes an array of fins 206 that protrude from the front side 148 of the front plate. The fins in the illustrated embodiment are pins or posts, but may have other shapes in other embodiments, such as ribs. The fins extend into the fluid distribution chamber 144 (shown in FIG. 2) defined between the manifold cover 142 and the front side 148 of the front plate. The fins increase the surface area of the front plate that contacts the cooling fluid within the fluid distribution chamber 144 to increase heat dissipation from the electronics packages (shown in FIG. 2) within the chassis to the cooling fluid. Thus, the front plate is a heat sink in addition to the bridge heat sinks and the rear plate.

In the illustrated embodiment, the manifold cover 142 has a box-shape including the rectangular base wall 146 and four side walls 208 that extend from edges of the base wall 146 to the front plate. Each of the side walls 208 is secured to one of the top 198, bottom 200, the first end 186, or the second end 188 of the front plate to mount the manifold cover 142 to the front plate. When mounted to the front plate, the base wall 146 is spaced apart from the front side 148 of the front plate to define the fluid distribution chamber 144 (shown in FIG. 2). The fluid distribution chamber 144 is defined along a lateral and vertical plane by the four side walls 208 of the manifold cover 142. In the illustrated embodiment, the manifold cover 142 defines three port openings 150 along the side wall 208 that engages the second end 188 of the front plate. Optionally, the other side walls 208 do not define port openings 150 such that cooling fluid enters the fluid distribution chamber 144 from one side of the manifold cover 142. In other embodiments, the port openings 150 are located along one or more different sides of the manifold cover 142. The manifold cover 142 is composed of a metallic material, such as the aluminum alloy used to form the front plate. In an embodiment, the manifold cover 142 is fused to the front plate via brazing, welding, soldering, or the like. For example, the metallic filler material is applied to interfaces between the front plate and the manifold cover 142, and the combination is brazed to fuse the front plate to the manifold cover 142. The interfaces may extend along the top 198, bottom 200, first end 186, and second end 188 of the front plate.

In an embodiment, each of the bridge heat sinks is defined by a base plate 210 and a fin plate 212 that are secured together. The base plate 210 and the fin plate 212 each define one of the left and right side walls 166, 168 (shown in FIG. 2) of the bridge heat sink 106. The fluid channel 128 (shown in FIG. 2) of the bridge heat sink 106 is defined between an interior surface 214 of the base plate 210 and an interior surface 216 of the fin plate 212. The fin plate 212 includes plural fins 218 that extend from the interior surface 216 towards the interior surface 214 of the base plate 210. The fins 218 in the illustrated embodiment are ribs that each extends longitudinally between the front end 132 and the rear end 136 of the respective bridge heat sink 106. Distal ends of the fins 218 may or may not engage the interior surface 214 of the base plate 210. In the illustrated embodiment, the base plate 210 does not include fins, but in an alternative embodiment both plates define fins.

The base plate 210 and the fin plate 212 engage one another along a top interface 220 at or proximate to a top 224 of the bridge heat sink 106 and along a bottom interface 222 at or proximate to a bottom 226 of the bridge heat sink 106. The base plate 210 is joined or fused to the fin plate 212 at the top and bottom interfaces 220, 222 through a brazing, welding, or soldering process to form a unitary, one-piece bridge heat sink 106. For example, the base plate 210 and the fin plate 212 are formed of one or more metallic materials, such as an aluminum alloy. The base plate 210 is coupled to the fin plate 212, and a metallic filler material is applied at the top and bottom interfaces 220, 222. The coupled plates may then be brazed, such as via dip-brazing, to fuse the plates together, forming the unitary bridge heat sink 106. The filler material seals the top and bottom interfaces, preventing the passage of fluids across the interfaces. Thus, the bridge heat sinks in an embodiment are sealed along the top 224 and the bottom 226, but open along the front end 132 and the rear end 136 to define the front and rear openings 130, 134 (shown in FIG. 2) of the bridge heat sinks.

Figure 5:
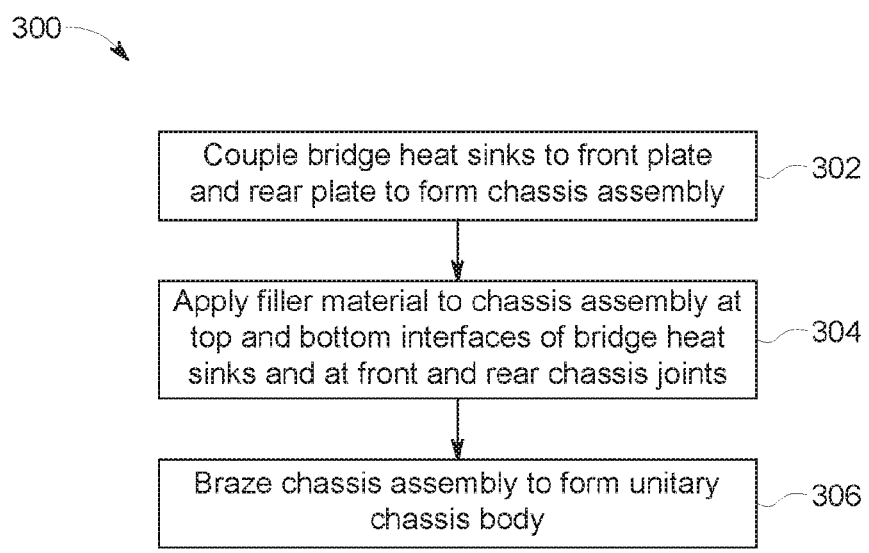
FIG. 5 is a flow chart of one embodiment of a method for forming a heat transfer chassis.

FIG. 5 is a flow chart of one embodiment of a method 300 for forming a heat transfer chassis for an electronics system that includes plural electronics packages held in the chassis. At 302, multiple bridge heat sinks are coupled to a front plate and to a rear plate to form a chassis assembly. The bridge heat sinks are positioned between the front plate and the rear plate. The bridge heat sinks each include a base plate and a fin plate that engage one another at a respective top interface and a respective bottom interface. The respective base and fin plates of each bridge heat sink define a fluid channel laterally therebetween that extends through the bridge heat sink. More specifically, the fluid channel is defined between an interior surface of the base plate and an interior surface of the fin plate. The fluid channel extends longitudinally between a front end and a rear end of the respective bridge heat sink. As part of the coupling process, the base plate of each bridge heat sink is aligned with and coupled to the respective fin plate. The base and fin plates are coupled together, at least temporarily, to hold the base plate in position relative to the fin plate during a subsequent heat application. The base plate is coupled to the fin plate using pins, clips, clamps, an adhesive or glue, or the like.

The chassis assembly is assembled using fasteners (e.g., pins, clips, clamps, or the like) and/or adhesives or glue to couple the bridge heat sinks between the front and rear plates. In the chassis assembly, the front ends of the bridge heat sinks engage the front plate, and the rear ends of the bridge heat sinks engage the rear plate. The bridge heat sinks are positioned such that front openings of the fluid channels align with and are fluidly connected to corresponding front slots defined through the front plate, and rear openings of the fluid channels align with and are fluidly connected to corresponding rear slots defined through the rear plate. The bridge heat sinks are laterally spaced apart from one another along widths of the front and rear plates. Each pair of adjacent bridge heat sinks defines a corresponding cavity therebetween. The cavity receives at least one electronics package therein. The bridge heat sinks are configured to thermally engage the electronics packages in the cavities to absorb and dissipate heat generated by the electronics packages.

At 304, a metallic filler material is applied to the chassis assembly at the top and bottom interfaces of the bridge heat sinks and at front and rear chassis joints of the chassis assembly. The front chassis joints are defined between the front ends of the bridge heat sinks and a back side of the front plate. The rear chassis joints are defined between the rear ends of the bridge heat sinks and a front side of the rear plate. The metallic filler material is formed of a metal alloy that includes one or more of copper, nickel, iron, silver, aluminum, silicon, gold, or the like. The metallic filler material is applied to the chassis assembly as a paste, a powder, a slurry, a foil, a wire, a ribbon, a cream, or the like. The metallic brazing material is applied to the chassis joints prior to or during a heat application. The metallic filler material has a lower melting point temperature than the other components of the chassis assembly. For example, the bridge heat sinks (including the base plates and fin plates thereof), the front plate, and the rear plate are composed of an aluminum alloy that has a higher melting point temperature than the metallic filler material. The temperature of a brazing bath (described below with reference to step 306) is higher than the melting point temperature of the filler material but lower than the melting point temperature of the aluminum alloy. The metallic filler material is applied along the lengths of the top and bottom interfaces of each of the bridge heat sinks to seal the interfaces. The metallic filler material may be applied along the lengths of the front and rear chassis joints to seal the interfaces between the bridge heat sinks and the front and rear plates, respectively.

At 306, the chassis assembly is brazed or heated to form a unitary chassis body. The chassis assembly is brazed via torch brazing, a furnace brazing, or dip brazing. In dip brazing, the chassis assembly, in the assembled arrangement, is submerged in a hot bath of molten salt. The bath melts the metallic filler material without melting the bridge heat sinks (including the base plates and fin plates) or the front and rear plates. The filler material fills the top and bottom interfaces and the front and rear chassis joints. Upon removing the chassis assembly from the heat (e.g., pulling the chassis assembly out of the bath), the filler material cools and solidifies, fusing the base plates to the respective fin plates to form each of the bridge heat sinks as a unitary, one-piece member. The cooling and solidifying filler material fuses the bridge heat sinks to the front plate and to the rear plate at the front and rear chassis joints, respectively. In response to the bridge heat sinks fusing to the front and rear plates, the chassis assembly has a unitary, one-piece chassis body. The unitary chassis body after the brazing step is equivalent to a body that is originally molded as one integral metal body (instead of multiple discrete metal components). The metallic filler material seals the front and rear chassis joints to prevent fluids from leaking through the chassis joints. In an embodiment, the metallic filler material is electrically conductive and thermally conductive. Thus, the filler material may provide electromagnetic interference (EMI) shielding for the electronics packages and may provide a conductive path that connects the bridge heat sinks and the front and rear plates, allowing the chassis to define a ground circuit to electrically common grounding elements of the electronics packages.

Optionally, brazing the chassis assembly may include brazing a manifold cover to the front plate. The manifold cover is box-shaped and includes a base wall and four side walls that extend from edges of the base wall. The metallic filler material is applied at interfaces between the four side walls of the manifold cover and the front plate, and during the brazing process the manifold cover fuses to the front plate to define a fluid distribution chamber within the four side walls between the base wall and a front side of the front plate. The fluid distribution chamber aggregates or distributes the cooling fluid relative to the fluid channels of the bridge heat sinks.

After forming the heat transfer chassis, the method 300 may further include loading a first electronics package into one of the cavities between one pair of adjacent bridge heat sinks. The first electronics package thermally engages a first bridge heat sink of the pair such that the first bridge heat sink receives heat emitted from the first electronics package and passively transfers the heat to a cooling fluid within the fluid channel of the first bridge heat sink. In addition, a second electronics package is loaded into the same cavity between the first electronics package and a second bridge heat sink of the pair of adjacent bridge heat sinks. The second electronics package thermally engages the second bridge heat sink such that the second bridge heat sink receives heat emitted from the second electronics package and passively transfers the heat to the cooling fluid within the fluid channel of the second bridge heat sink.

In an alternative embodiment, the bridge heat sinks are formed prior to the brazing step in 306 above. For example, the base plates are brazed to the respective fin plates to form the bridge heat sinks in a separate brazing process prior to step 306. In another example, the bridge heat sinks are formed by an extrusion process, a different welding process, or the like, prior to being coupled to the front and rear plates to form the chassis assembly.

Figure 6:
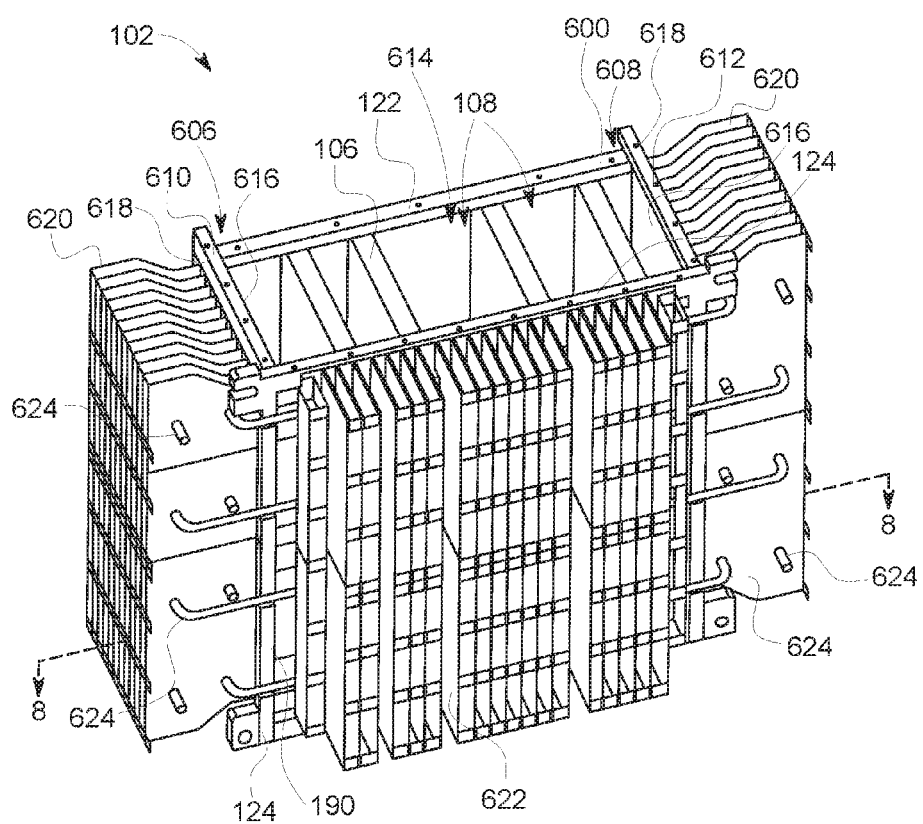
FIG. 6 is a rear perspective view of the chassis system according to another embodiment.
Figure 7:
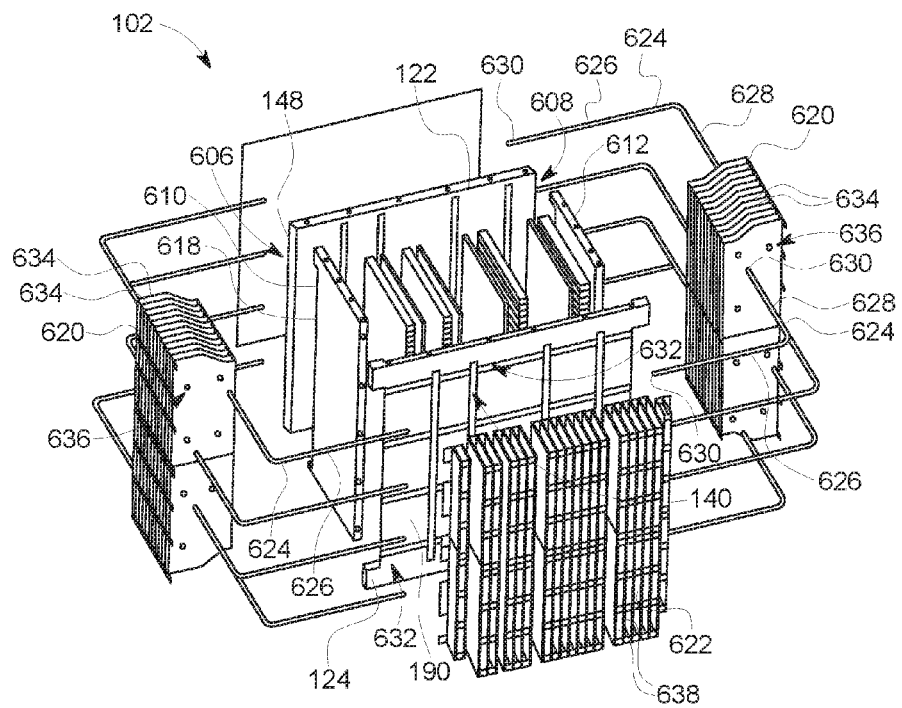
FIG. 7 is a rear exploded view of the chassis system shown in FIG. 6.
Figure 8:
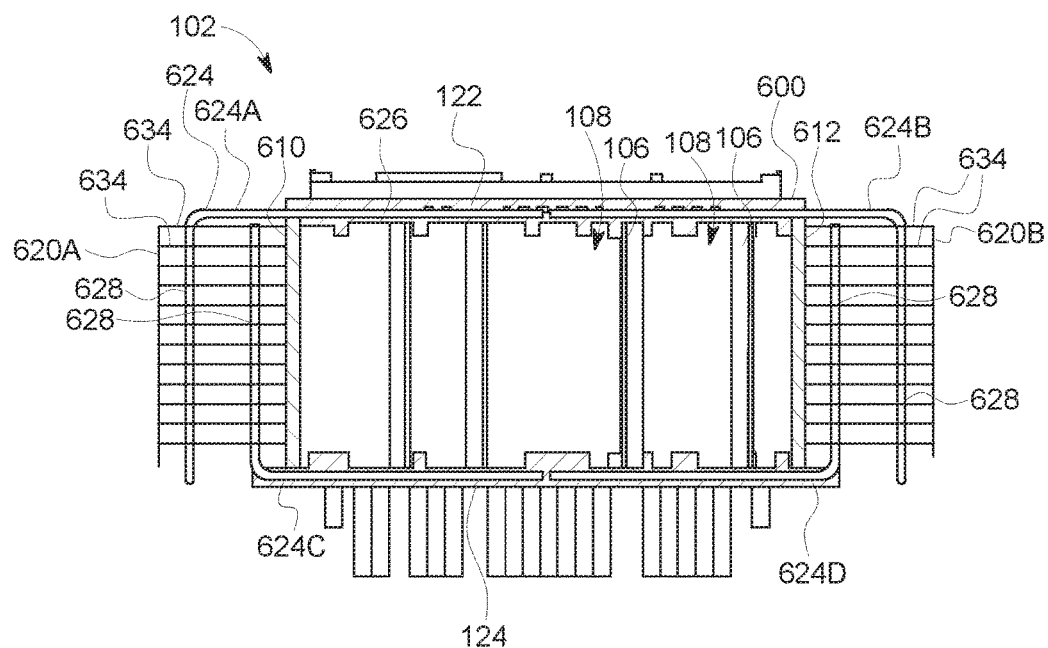
FIG. 8 is a cross-sectional view of the chassis system of FIG. 6 along line 8-8 shown in FIG. 6.

FIGS. 6-8 show the chassis system 102 according to another embodiment. FIG. 6 is a rear perspective view of the chassis system 102. FIG. 7 is a rear exploded view of the chassis system 102. FIG. 8 is a cross-sectional view of the chassis system 102 along line 8-8 shown in FIG. 6. At least some of the components of the chassis system shown in FIGS. 6-8 are the same as the components in the chassis system 102 shown in FIGS. 1-5, such as the bridge heat exchangers 106, the front plate 122, and the rear plate 124.

Referring to FIG. 6, the chassis system 102 includes a chassis case 600, at least one fin bank 620 mounted to the chassis case, and at least one heat pipe 624. The chassis case 600 includes the front plate 122, the rear plate 124, and at least one bridge heat exchanger 106 extending between and coupling to the front and rear plates. The front plate extends laterally between a first end 606 and an opposite second end 608. The chassis case 600 also includes a first side plate 610 and a second side plate 612 that extend between and couple to the front and rear plates. The first side plate is coupled to the front plate at least proximate to the first end, and the second side plate is coupled to the front plate at least proximate to the second end. The first and second side plates 610, 612 and the front and rear plates 122, 124 define a chamber 614 that extends longitudinally between the front and rear plates and laterally between the side plates. The one or more bridge heat exchangers 106 are located between the first and second side plates within the chamber 614. The bridge heat exchangers divide and segment the chamber into the cavities 108 that receive the electronics packages 104 (shown in FIG. 1) therein.

The side plates have inner sides 616 that face the other side plate and define walls of the chamber. The side plates have outer sides 618 that face away from the other side plate. In an embodiment, the chassis system includes fin bank heat exchangers 620 (referred to herein as fin banks 620) mounted to the outer sides 618 of the first and second side plates. The fin banks 620 extend along the outer sides 618 of the corresponding side plates and are exposed to the external environment, such as an ambient air flow. In an alternative embodiment, only the first side plate 610 or the second side plate 612 has a fin bank 620 mounted thereto, instead of both side plates 610, 612 having a corresponding fin bank 620. Optionally, the chassis system includes a fin bank heat exchanger 622 (referred to herein as fin bank 622) that is mounted along the back side 190 of the rear plate. The fin bank 622 is similar to the fin banks 620. The fin bank 622 in the illustrated embodiment covers a larger surface area than the fin banks 620 individually due to the rear plate having a larger surface area than the side plates 610, 612. The fin banks 620, 622 are configured to dissipate heat from the chassis system passively via the natural convection that occurs when an ambient air (or other fluid) flows through and/or across the fin banks.

The chassis system further includes at least one heat pipe 624 mounted to the rear plate and at least one heat pipe 624 mounted to the front plate. In the illustrated embodiment, the chassis system includes sixteen heat pipes (shown in exploded view in FIG. 7), but other numbers of heat pipes are installed in other embodiments. The heat pipes are spaced apart vertically at different locations along the height of the chassis case. The heat pipes contain a cooling fluid therein. The cooling fluid within the heat pipes is referred to herein as a second cooling fluid to distinguish from the cooling fluid that flows through the fluid channels 128 (shown in FIG. 2) of the bridge heat exchangers 106, which is referred to as a first cooling fluid. Each heat pipe extends along at least one of the front plate or the rear plate such that an extended length of the heat pipe is in contact with the corresponding plate. For example, the heat pipes are at least partially embedded in the corresponding front and rear plates. The heat pipes extend to and at least partially through at least one of the fin banks 620 mounted along the side plates. In an embodiment, the heat pipes provide a closed fluid path for the second cooling fluid to transfer heat absorbed from the front and rear plates to one or both of the fin banks 620 for dissipating the heat to the external environment.

In an embodiment, the chassis system operates in an active mode when forced cooling fluid is available and operates in a passive mode when forced cooling fluid is not available or not required. In the active mode, as described above, the first cooling fluid is forced via the fan 152 (shown in FIG. 2) or another fluid-propulsion device through the slots 138 (FIG. 2) in the front plate, the fluid channels 128 of the bridge heat exchangers 106, and the slots 140 (FIG. 2) in the rear plate. The forced cooling fluid (e.g., air) convectively dissipates heat that is absorbed by the thermally-conductive surfaces of the bridge heat exchangers 106 and the front and rear plates from the heat-generating electronics packages 104 (FIG. 2). In the passive mode of operation, thermal relief is provided to the electronics packages in the chassis case by providing a conductive heat path from the thermally-conductive chassis case along the heat pipes 624 to the fin banks 620, which dissipate heat via natural convection into the ambient air. Therefore, even when active cooling is not provided, heat is dissipated from the electronics packages by passively transferring the heat to the fin banks using the heat pipes.

Referring now to the exploded view of the chassis system in FIG. 7, the heat pipes are L-shaped such that each heat pipe includes a first section 626 and a second section 628 that are angled relative to each other. The first and second sections may each be generally linear and connected to one another at a curved corner of the heat pipe. The first and second sections optionally are oriented orthogonally to each other. The first section 626 is integrated into the front plate or the rear plate, and the second section 628 extends at least partially through the fin bank 620 (when assembled). In an alternative embodiment, a single heat pipe may have three or four sections instead of two, such that the heat pipe extends along at least three sides of the chassis case 600 (shown assembled in FIG. 6) instead of along two sides of the case. For example, a single heat pipe may extend along an entire perimeter of the chassis case, and the heat pipe may include some sections that extend along the front and rear plates and other sections that extend at least partially through the fin banks on each side plate.

The heat pipes are composed of a thermally-conductive metal material, such as copper. The heat pipes are hollow to contain the second cooling fluid therein. In the illustrated embodiment, the heat pipes have closed or sealed ends 630 such that a fixed volume of the second cooling fluid is contained in each heat pipe. The second cooling fluid is water. For example, the water is in the gas phase as water vapor upon absorbing heat generated by the electronics packages (shown in FIG. 1), and the vapor may condense to liquid water along the second section that extends through the fin bank as latent heat of the water is transferred to the fin bank. Optionally, additives are added to the water in the heat pipes or another type of fluid is contained in the heat pipes. In an alternative embodiment, the heat pipes are solid such that the heat pipes do not contain a cooling fluid and are used for conductive heat transfer only.

In an embodiment, the heat pipes are integrated into the chassis case by being embedded into the front plate and the rear plate. For example, as shown in FIG. 7 the rear plate 124 defines grooves 632 that extend laterally along the back side 190 thereof. The grooves may be machine-formed into the rear plate. The grooves extend laterally across at least a portion of a width of the rear plate. In the illustrated embodiment, each groove extends across the entire width of the rear plate and is segmented by the slots 140 of the rear plate. The rear plate includes multiple grooves that extend parallel to one another and are spaced apart vertically. The first sections 626 of some of the heat pipes are received in the grooves of the rear plate to embed the heat pipes in the rear plate. For example, each groove receives the first section of two different heat pipes that extend from opposite ends of the rear plate into different fin banks 620. Although not shown in FIG. 7, the front plate also includes grooves defined along the front side 148 thereof that resemble the grooves of the rear plate and are also configured to receive the first sections of some heat pipes. For example, the grooves in the front plate extend laterally across at least a portion of the width of the front plate between the first and second ends. Since the heat pipes and the front and rear plates are formed of thermally-conductive metal materials, the contact between the heat pipes and the front and rear plates along the grooves provides a conductive heat transfer path.

The fin banks 620 in an embodiment include multiple thermally-conductive panels 634 extending from the outer sides 618 of the corresponding first and second side plates 610, 612. The side plates 610, 612 extend a length between the front and rear plates 122, 124. The panels 634 in each of the fin banks are spaced apart from one another along the length of the corresponding side plate to define air gaps between adjacent panels. The panels may extend parallel to each other. The panels may be at least partially planar. In the illustrated embodiment, each panel extends generally vertically, but in an alternative embodiment may extend generally longitudinally and may be vertically spaced apart from adjacent panels. The panels of the fin banks are composed of one or more thermally-conductive metals, such as copper, aluminum, or the like. At least some of the panels 634 define one or more apertures 636 therethrough that are sized to accommodate the heat pipes 624. For example, the second sections 628 of the heat pipes are configured to be inserted into the apertures 636 of the panels 634 to extend at least partially through the fin banks. The apertures optionally may have approximately the same size as the outer diameters of the heat pipes such that the heat pipes mechanically engage the edges of the panels that define the apertures to provide a conductive heat transfer path between the heat pipes and the panels. The fin bank 622 on the rear plate 124 may have parallel panels 638 similar to the panels 634 of the fin banks 620. Optionally, the heat pipes are embedded in the rear plate and do not extend through any apertures in the panels of the fin bank. The panels engage and extend from the rear plate such that the panels are used to dissipate heat absorbed from the rear plate to the ambient environment.

FIG. 8 shows a cross-sectional view of the assembled chassis system along the line 8-8 shown in FIG. 6. Only four heat pipes 624 are visible in the illustrated view. A first heat pipe 624A and a second heat pipe 624B are embedded in the front plate 122. A third heat pipe 624C and a fourth heat pipe 624D are embedded in the rear plate 124. The second sections 628 of the first and third heat pipes 624A, 624C extend through the first fin bank 620A mounted on the first side plate 610. The second sections 628 of the second and fourth heat pipes 624B, 624D extend through the second fin bank 620B mounted on the second side plate 612. Although not shown in FIG. 8, the second sections of the heat pipes 624A-D extend through the apertures 636 (shown in FIG. 7) in the panels 634 of the corresponding fin banks 620A, 620B. In the illustrated embodiment, the second section of each heat pipe 624A-D extends through all of the panels in the corresponding fin bank 620A, 620B, but in other embodiments may extend through only a subset of the panels. The second section 628 of the first heat pipe 624A is spaced apart laterally from the second section 628 of the third heat pipe 624C in the fin bank 620A. For example, the first heat pipe 624A is disposed farther from the first side plate 610 than a proximity of the third heat pipe 624C to the first side plate. The spacing between the second sections 628 of the heat pipes 624A, 624C allows ambient air to flow between the heat pipes 624A, 624C in the air gaps of the fin bank 620A, which may increase a heat dissipation rate relative to a prospective heat dissipation rate if the second sections 628 would be disposed right next to each other. Likewise, the second section 628 of the second heat pipe 624B is spaced apart laterally from the second section 628 of the fourth heat pipe 624D in the fin bank 620B.

In an embodiment, the chassis case 600, the heat pipes 624, and the fin banks 620 are composed of thermally-conductive materials and define a conductive heat transfer path from the electronics packages 104 (shown in FIG. 1) disposed in the cavities 108 to the fin banks 620 to dissipate heat from the electronics packages even when no cooling fluid is forced through the fluid channels 128 (shown in FIG. 2) of the bridge heat exchangers 106. For example, heat from an electronics package is conductively transferred to a bridge heat exchanger in contact with the electronics package. At least some of the heat is transferred along the metal of the bridge heat exchanger 106 to the metal of the front plate 122, and then to the first section 626 of the first heat pipe 624A in contact with (e.g., embedded in) the front plate. The heat transferred to the heat pipe 624A is conveyed along a length of the heat pipe 624A to the fin bank 620A via conduction along the heat pipe 624A and convection via the second cooling fluid within the heat pipe 624A. The heat is transferred from the heat pipe 624A and the second cooling fluid therein to the fin bank 620A, where the heat is dissipated to the ambient air via convection. Another conductive heat transfer path extends to the other fin bank 620B via the second heat pipe 624B. Still other conductive heat transfer paths extend from the bridge heat exchangers 106 through the rear plate 124 to the two fin banks 620A, 620B via the third and fourth heat pipes 624C, 624D, respectively. The fin banks 620, 622 and/or the heat pipes 624 optionally are dip-brazed with the chassis case 600 to mechanically and thermally couple the fin banks and/or the heat pipes to the chassis case.

In one or more embodiments, a dual mode thermal management system for dissipating heat from electronics includes an assembly of heat pipes (e.g., heat pipes 624), external fin banks (e.g., fin banks 620, 622), and internal heat exchangers (e.g., bridge heat exchangers 106). An active mode offers active cooling to electronics when forced cooling air is available using the internal heat exchangers.

The internal heat exchangers conduct heat away from the electronics and into the forced air stream passing through the internal heat exchangers. Passive mode offers thermal management to electronics using the internal heat pipes and the external fin banks when no forced cooling air is available. The heat pipes are integrated into the assembly of heat exchangers to conduct heat from inside the chassis to the external fin banks facing out from the chassis to provide cooling capacity when no forced air is available or required.

In one or more embodiments described herein, each of multiple internal heat exchangers begins as two separate pieces that are brazed together to create a single heat exchanger assembly with a thermally-designed fin geometry. The heat exchangers are spaced apart and stacked between a conductive front plate and a conductive back or rear plate. A cover is mounted to the front face of the front plate to create an exhaust manifold that receives hot air from the internal heat exchangers and exhausts it to atmosphere via openings on the bottom of the panel during the active mode. The front face of the front plate includes pin fins to provide additional convective cooling surface area. Inlet slots in the back plate allow cooling air to enter each internal heat exchanger. All of these components are then dip-brazed, with a filler material at each interface, to form a unitary, one-piece assembly which requires no gaskets or other means to prevent air leaks. The unitary assembly has a thermally conductive interface between each part to allow heat to be conducted away from the electronics across the entirety of the assembly for increased dissipation of heat to ambient air (relative to assemblies that have less thermally-conductive surface area). The interfaces between the parts are not only thermally conductive, but electrically conductive to allow the assembly to function as a grounding source for the electronics. Under the passive mode of operation (e.g., without forced cooling air), heat is dissipated from the electronics by using external fin banks on the sides and back of the chassis to increase the amount of natural convection surface area. The fin banks are used in conjunction with heat pipes that are embedded (e.g., thermally and mechanically bonded) into grooves in the front and back plates in order to efficiently transport heat from the chassis to the external fin banks.

The chassis assembly can be scaled in size based on type, quantity, and size of the electronics to be cooled, amount of heat to dissipate, and quantity of available air for cooling. The interfaces between the internal heat exchangers and the electronics can be tuned to accommodate the design characteristics of the electronics. For example, some electronics may require edge conduction based on constraints from device layout in the body of the circuit board of the electronics, while other electronics have an entire face available for conducting heat away, and may use a thermal interface material between the face of the internal heat exchanger the face of the electronic package to conduct heat.

One or more technical effects of the embodiments described herein include an ability to provide dual mode electronics cooling for both active and passive heat dissipation. Another technical effect may include an ability to distribute cooling air from a single source to multiple heat exchangers and in the reverse direction from multiple heat exchangers to a single output port using a fluid distribution chamber. Another technical effect may include increased thermal heat dissipation due to providing thermally conductive interfaces between the components of the chassis. Yet another technical effect may be preventing leaks from the internal bridge heat exchangers into the cavities that hold the electronics without the use of gasket of epoxy, such as due to dip-brazing the components of the chassis. Eliminating direct contact and interaction between the electronics and the cooling air that is forced through the internal heat exchangers during the active mode may provide another technical effect of maintaining cleanliness and reliability of the electronics. Another technical effect may be an ability to use the chassis system for grounding the electronics held therein due to the conductive interfaces. The integration of the heat pipes and the external fin banks may provide a technical effect of increased thermal efficiency (relative to not including the fin banks and the heat pipes) in the active mode when cooling air is present, and may provide cooling for the electronics in the passive mode even when no forced cooling air is present.

In an embodiment, a system (e.g., a heat transfer chassis) includes a front plate, a manifold cover, and bridge heat sinks. The front plate has a front side and a back side. The front plate defines multiple slots through the front plate between the front and back sides. The manifold cover is secured to the front plate to define a fluid distribution chamber along the front side of the front plate. The manifold cover defines a port opening through which a cooling fluid is received from outside of the manifold cover. The bridge heat sinks extend rearward from the back side of the front plate. The bridge heat sinks define fluid channels that are fluidly connected with the fluid distribution chamber through the corresponding slots of the front plate. The fluid distribution chamber distributes the cooling fluid received from outside of the manifold cover through the fluid channels of the bridge heat sinks in order to cool one or more electronics packages disposed along the bridge heat sinks without the cooling fluid engaging the one or more electronics packages.

In an aspect, the fluid distribution chamber receives ambient air as the cooling fluid.

In an aspect, the front plate and the bridge heat sinks are electrically conductive. The front plate is joined to the bridge heat sinks at respective front chassis joints that are electrically conductive. The front plate and the bridge heat sinks define a ground path that extends across the front chassis joints to electrically ground at least one of the one or more electronics packages to an electronic ground reference.

In an aspect, the bridge heat sinks are spaced apart from each other along a width of the front plate to define cavities between adjacent bridge heat sinks that are shaped and sized to receive the one or more electronics packages.

In an aspect, the cavity defined between a pair of adjacent bridge heat sinks receives two electronics packages such that a first bridge heat sink of the pair is thermally engaged with one of the two electronics packages to cool the one electronics package and a second bridge heat sink of the pair is thermally engaged with the other of the two electronics packages to cool the other electronics package.

In an aspect, each of the bridge heat sinks includes a base plate and a fin plate joined together to define the respective bridge heat sink. The base plate is joined to the fin plate along a top interface and a bottom interface. The fluid channel of each bridge heat sink is defined laterally between respective interior surfaces of the base plate and the fin plate. The fin plate includes plural fins that protrude from the interior surface of the fin plate towards the base plate.

In an aspect, the bridge heat sinks include a metallic filler material disposed along the top interfaces and the bottom interfaces between the respective base plates and the fin plates. The metallic filler material on each bridge heat sink fuses the base plate to the fin plate and seal the top and bottom interfaces responsive to a heat application at one or more temperatures above a melting point of the metallic filler material and below respective melting points of the base plate and the fin plate.

In an aspect, the bridge heat sinks extend longitudinally between front ends and rear ends. The front ends of the bridge heat sinks are joined to the front plate. The system further includes a rear plate joined to the rear ends of the bridge heat sinks. The rear plate defines multiple slots therethrough. The fluid channels of the bridge heat sinks at the rear ends are fluidly connected to the corresponding slots of the rear plate such that the cooling fluid is discharged through the slots of the rear plate upon exiting the fluid channels.

In an aspect, the front plate includes an array of fins that protrude from the front side of the front plate and the rear plate includes an array of fins that protrude from a back side of the rear plate.

In an aspect, the manifold cover includes a base wall and multiple side walls that extend from edges of the base wall to the front plate. The fluid distribution chamber is at least partially defined between the base wall and the front side of the front plate. The port opening of the manifold cover extends through one of the side walls.

In an aspect, front ends of the bridge heat sinks engage the back side of the front plate at respective front chassis joints. The system further includes a metallic filler material disposed along the front chassis joints. The metallic filler material is configured to fuse the bridge heat sinks to the front plate and seal the front chassis joints responsive to a heat application at one or more temperatures above a melting point of the metallic filler material and below respective melting points of the front plate and the bridge heat sinks.

In an aspect, the bridge heat sinks include planar side walls that face the one or more electronics packages. The planar side wall of at least one of the bridge heat sinks abuts a thermally conductive panel of a corresponding adjacent electronics package to thermally engage the adjacent electronics package via face-to-face conduction.

In an aspect, the bridge heat sinks include a planar side walls that face the one or more electronics packages. At least one of the bridge heat sinks includes a front ledge at a front end of the respective bridge heat sink and a rear ledge at a rear end of the respective bridge heat sink. The front and rear ledges project beyond the planar side wall of the respective bridge heat sink and abutting a thermally conductive panel of a corresponding adjacent electronics package to thermally engage the electronics package via edge-to-edge conduction without the planar side wall engaging the electronics package.

In an aspect, the bridge heat sinks extend parallel to one another and generally perpendicular to the front plate.

In an aspect, the bridge heat sinks extend longitudinally between front ends and rear ends. The front ends of the bridge heat sinks are joined to the front plate. The system further includes a rear plate joined to the rear ends of the bridge heat sinks. The rear plate defines multiple slots therethrough. The fluid channels of the bridge heat sinks at the rear ends are fluidly connected to the corresponding slots of the rear plate such that the cooling fluid is discharged through the slots of the rear plate upon exiting the fluid channels. The front plate and the bridge heat sinks are electrically conductive. The front plate is joined to the bridge heat sinks at respective front chassis joints that are also electrically conductive. The front plate and the bridge heat sinks define a ground path that extends across the front chassis joints to electrically ground at least one of the one or more electronics packages to an electronic ground reference.

The bridge heat sinks extend parallel to one another and generally perpendicular to the front plate and are spaced apart from each other along a width of the front plate and the rear plate to define cavities between adjacent bridge heat sinks that are shaped and sized to receive the one or more electronics packages.

In an aspect, front ends of the bridge heat sinks engage the back side of the front plate at respective front chassis joints. The bridge heat sinks are fused to the front chassis joints by a fused metallic filler material disposed along the front chassis joints. The metallic filler material has a melting point above an operational temperature of the system and below respective melting points of the front plate and the bridge heat sinks.

In another embodiment, a method (e.g., for forming a heat transfer chassis) includes coupling a plurality of bridge heat sinks between a front plate and a rear plate to form a chassis assembly. The bridge heat sinks each include a base plate and a fin plate that engage one another at a respective top interface and a respective bottom interface and define a fluid channel laterally therebetween that extends through the bridge heat sink. Front openings of the fluid channels of the bridge heat sinks are fluidly connected to corresponding front slots defined through the front plate. Rear openings of the fluid channels are fluidly connected to corresponding rear slots defined through the rear plate. The bridge heat sinks are laterally spaced apart from one another to define cavities between pairs of adjacent bridge heat sinks. The method also includes applying a metallic filler material to the chassis assembly at the top interfaces and the bottom interfaces of the bridge heat sinks and at front and rear chassis joints of the chassis assembly. The front chassis joints are defined between the bridge heat sinks and the front plate. The rear chassis joints are defined between the bridge heat sinks and the rear plate. The method further includes brazing the chassis assembly to form a unitary chassis body. The metallic filler material fuses the base plates to the respective fin plates of the bridge heat sinks at the respective top and bottom interfaces. The metallic filler material fuses the bridge heat sinks to the front plate and to the rear plate at the front chassis joints and rear chassis joints, respectively.

In an aspect, the method further includes distributing a cooling fluid received from outside of the front plate through the front slots and into the fluid channels of the bridge heat sinks in order to cool one or more electronics packages disposed along the bridge heat sinks.

In an aspect, the method further includes loading first electronics package and a second electronics package into a corresponding cavity defined between one pair of adjacent bridge heat sinks. The first electronics package is disposed proximate to a first bridge heat sink of the pair and the second electronics package disposed between the first electronics package and a second bridge heat sink of the pair. The first bridge heat sink is configured to cool the first electronics package by transferring heat received from the first electronics package to a cooling fluid within the fluid channel of the first bridge heat sink. The second bridge heat sink is configured to cool the second electronics package by transferring heat received from the second electronics package to the cooling fluid within the fluid channel of the second bridge heat sink.

In an aspect, the metallic filler material is electrically conductive and thermally conductive.

In an aspect, the method further includes coupling a manifold cover to the front plate to define a fluid distribution chamber. The fluid distribution chamber is configured to receive a cooling fluid therein from outside of the manifold cover through a port opening and distribute the cooling fluid through the fluid channels of the bridge heat sinks to cool one or more electronics packages disposed along the bridge heat sinks without the cooling fluid engaging the one or more electronics packages.

In an aspect, the front plate, the rear plate, and both of the base plates and the fin plates of the bridge heat sinks are composed of an aluminum alloy. The metallic filler material has a lower melting point than the aluminum alloy.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter described herein without departing from its scope. While the dimensions and types of materials described herein are intended to define the parameters of the disclosed subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and to enable a person of ordinary skill in the art to practice the embodiments of inventive subject matter, including making and using any devices or systems and performing any incorporated methods. The patentable scope of the inventive subject matter is defined by the claims, and may include other examples that occur to a person of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that incorporate the recited features. Moreover, unless explicitly stated to the contrary, embodiments "comprising" or "having" an element or a plurality of elements having a particular property may include additional such elements not having that property.

As used herein, the terms "system," "device," or "unit" may include a hardware and/or software system that operates to perform one or more functions. For example, a unit, device, or system may include a computer processor, controller, or other logic-based device that performs operations based on instructions stored on a tangible and non-transitory computer readable storage medium, such as a computer memory. Alternatively, a unit, device, or system may include a hard-wired device that performs operations based on hard-wired logic of the device. The units, devices, or systems shown in the attached figures may represent the hardware that operates based on software or hardwired instructions, the software that directs hardware to perform the operations, or a combination thereof. The systems, devices, or units can include or represent hardware circuits or circuitry that include and/or are connected with one or more processors, such as one or computer microprocessors.

Because changes may be made in the above-described systems and methods, without departing from the scope of the inventive subject matter herein involved, all of the subject matter of the above description or shown in the accompanying drawings are examples illustrating the inventive concept herein.

What is claimed is:

1. A system comprising:
   a front plate having a front side and a back side and a first end and second end, the front plate defining a slot extending through the front plate from the front side through to the back side;
   a first side plate and a second side plate coupled to and extending rearward from the front plate, the first side plate including a fin bank mounted on an outer side thereof that faces away from the second side plate;
   a bridge heat sink coupled to and extending rearward from the back side of the front plate between the first and second side plates, the bridge heat sink including a first conductive plate that defines a left planar side wall and a second conductive plate that defines a right planar side wall, wherein interior surfaces of the first and second conductive plates define a fluid channel that is fluidly connected to the slot of the front plate, the fluid channel configured to receive a first cooling fluid therein to dissipate heat from one or more electronics packages engaging the bridge heat sink, wherein the one or more electronics packages are engaged with one or more of the left planar side wall of the first conductive plate or the right planar side wall of the second conductive plate at one or more positions along a length of the left planar side wall or the right planar side wall; and
   a heat pipe coupled to the front plate, the heat pipe containing a second cooling fluid therein, the heat pipe extending to and a distance through the fin bank, the heat pipe providing a closed fluid path for the second cooling fluid to transfer heat absorbed from the front plate to the fin bank for dissipating heat to an external environment.

2. The system of claim 1, wherein the heat pipe includes a first section that is embedded in the front plate and a second section that extends a distance through the fin bank, the first section being angled relative to the second section.

3. The system of claim 1, wherein the front plate defines a groove along the front side, the groove extending laterally across at least a portion of a width of the front plate between the first and second ends, a first section of the heat pipe being held in the groove.

4. The system of claim 1, wherein the fin bank includes multiple thermally conductive panels extending from the outer side of the first side plate, the panels in the fin bank spaced apart from one another along a length of the first side plate and defining apertures sized to receive the heat pipe, the heat pipe extending through the apertures of multiple panels in the fin bank.

5. The system of claim 1, wherein the bridge heat sink extends longitudinally between a front end and a rear end, the front end coupled to the front plate, the system further comprising a rear plate coupled to the rear end of the bridge heat sink, the rear plate defining a slot therethrough that is fluidly connected to the fluid channel of the bridge heat sink such that the first cooling fluid is configured to flow through the slot of the rear plate.

6. The system of claim 5, wherein the fin bank is a first fin bank, the rear plate having a front side and a back side, the front side coupled to the bridge heat sink, the system further comprising a second fin bank mounted on the back side of the rear plate to dissipate heat from the rear plate to the external environment.

7. The system of claim 5, wherein the heat pipe is a first heat pipe and the system further comprises a second heat pipe, the second heat pipe being coupled to the rear plate, the second heat pipe extending a distance through the fin bank, the second heat pipe being spaced apart from the first heat pipe in the fin bank.

8. The system of claim 1, wherein the first cooling fluid is configured to flow through the fluid channel of the bridge heat sink to dissipate heat from the one or more electronics packages engaging the bridge heat sink without direct contact between the cooling fluid and the one or more electronics packages.

9. The system of claim 1, wherein the front plate, the bridge heat sink, and the heat pipe are composed of thermally conductive metal materials and define a conductive heat transfer path from the one or more electronics packages to the fin bank, the conductive heat transfer path extending from the bridge heat sink in engagement with the one or more electronics packages through the front plate to the heat pipe, the conductive heat transfer path further extending along a length of the heat pipe to the fin bank.

10. The system of claim 1, wherein the second cooling fluid in the heat pipe is water.

11. The system of claim 1, further comprising a manifold cover secured to the front plate to define a fluid distribution chamber along the front side of the front plate, the manifold cover defining a port opening through which the first cooling fluid at least one of exits or enters the fluid distribution chamber.

12. The system of claim 1, wherein the bridge heat sink includes a base plate and a fin plate that are joined together, the fluid channel being defined between respective interior surfaces of the base plate and the fin plate, the fin plate including plural fins that protrude from the interior surface of the fin plate into the fluid channel.

13. A system comprising:
a chassis including a front plate, a rear plate, and first and second side plates coupled to and extending between the front plate and the rear plate to define a chamber, the chassis further including a bridge heat sink coupled to and extending between the front and rear plates between the first and second side plates, the bridge heat sink including a first conductive plate that defines a left planar side wall and a second conductive plate that defines a right planar side wall, wherein interior surfaces of the first and second conductive plates define a fluid channel therethrough that is fluidly connected to corresponding slots defined through the front and rear plates, wherein the one or more electronics packages are engaged with one or more of the left planar side wall of the first conductive plate or the right planar side wall of the second conductive plate at one or more positions along a length of the left planar side wall or the right planar side wall, the chassis configured to receive a first cooling fluid through the slots of the front and rear plates and the fluid channel of the bridge heat sink to dissipate heat from one or more electronics packages engaging one or more of the left planar side wall of the first conductive plate or the right planar side wall of the second conductive plate of the bridge heat sink within the chamber;
a fin bank mounted to the first side plate along an outer side thereof that faces away from the second side plate; and
a heat pipe coupled to the front plate, the heat pipe containing a second cooling fluid therein, the heat pipe extending to and a distance through the fin bank, the heat pipe providing a closed fluid path for the second cooling fluid to transfer heat absorbed from the front plate to the fin bank for dissipating heat to an external environment.

14. The system of claim 13, wherein the front plate, the bridge heat sink, and the heat pipe are composed of thermally conductive metal materials and define a conductive heat transfer path from the one or more electronics packages to the fin bank, the conductive heat transfer path extending from the bridge heat sink in engagement with the one or more electronics packages through the front plate to the heat pipe, the conductive heat transfer path further extending along a length of the heat pipe to the fin bank.

15. The system of claim 13, wherein the heat pipe is a first heat pipe, the system further comprising a second heat pipe coupled to the rear plate, the second heat pipe extending a distance through the fin bank, the second heat pipe being spaced apart from the first heat pipe in the fin bank.

16. The system of claim 13, wherein the heat pipe includes a first section that is embedded in the front plate and a second section that extends a distance through the fin bank, the first section being angled relative to the second section.

17. The system of claim 13, wherein the fin bank includes multiple thermally conductive panels extending from the outer side of the first side plate, the panels in the fin bank spaced apart from one another along a length of the first side plate and defining apertures sized to receive the heat pipe, the heat pipe extending through the apertures of multiple panels in the fin bank.

18. A system comprising: plural bridge heat sinks;
a chassis including a front plate, a rear plate, and first and second side plates coupled to and extending between the front plate and the rear plate to define a chamber, wherein each of the bridge heat sinks is coupled to and extends between the front and rear plates between the first and second side plates, the bridge heat sinks defining respective fluid channels therethrough that are fluidly connected to corresponding slots defined through the front and rear plates, the chassis configured to receive a first cooling fluid through the slots of the front and rear plates and the fluid
channels of the bridge heat sinks to dissipate heat from plural electronics packages engaging the bridge heat sinks within the chamber, each of the electronics packages comprising a respective thermally conductive panel having a first planar side and a second planar side;
a fin bank mounted to the first side plate along an outer side thereof that faces away from the second side plate; and a heat pipe coupled to the front plate, the heat pipe containing a second cooling fluid therein, the heat pipe extending to and a distance through the fin bank, the heat pipe providing a closed fluid path for the second cooling fluid to transfer heat absorbed from the front plate to the fin bank for dissipating heat to an external environment;

wherein for each bridge heat sink, the bridge heat sink respectively includes a first conductive plate that defines a left planar side wall and a second conductive plate that defines a right planar side wall, wherein the fluid channel of the bridge heat sink is defined between interior surfaces of the first and second conductive plates, and wherein a respective two electronics packages of the plural electronics packages respectively face the left and right planar side walls and are engaged with the first and second conductive plates such that heat from the two electronics packages is conducted through the first and second conductive plates and transferred to the first cooling fluid passing through the fluid channel of the bridge heat sink, the fluid channel disposed between the two electronics packages; and wherein one of the respective left planar side wall or the right planar side wall of each of two or more of the bridge heat sinks abuts the first planar side of the thermally conductive panel of the respective electronics package engaged therewith, across a respective engagement interface that extends a full length of the thermally conductive panel, electronics components of said respective electronics package coupled to the second planar side of the thermally conductive panel and not to the first planar side of the thermally conductive panel.

19. The system of claim 18, wherein the other of the respective left planar side wall or the right planar side wall of a first one of the two or more of the bridge heat sinks abuts the first planar side of the thermally conductive panel of the respective electronics package engaged therewith, across a respective engagement interface that extends a full length of the thermally
conductive panel of the respective electronics package engaged therewith, electronics components of said respective electronics package coupled to the second planar side of the thermally conductive panel and not to the first planar side of the thermally conductive panel.

20. The system of claim 19, wherein the other of the respective left planar side wall or the right planar side wall of a second one of the two or more of the bridge heat sinks is spaced apart from the thermally conductive panel of the respective electronics package engaged therewith, such that the second side of the thermally conductive panel of the respective electronics package engaged therewith faces the said other of the respective left planar side wall or the right planar side wall and with electronic components of the respective electronics package disposed between the second side of the thermally conductive panel and said other of the respective left planar side wall or the right planar side wall.

* * * * *